United States Patent

Taga et al.

[11] Patent Number: 5,764,098
[45] Date of Patent: Jun. 9, 1998

[54] BIAS CIRCUIT

[75] Inventors: Naoki Taga; Kiyotaka Yamashige, both of Tokyo, Japan

[73] Assignee: NEC Corporation, Tokyo, Japan

[21] Appl. No.: 686,362

[22] Filed: Jul. 24, 1996

[30] Foreign Application Priority Data

Jul. 27, 1995 [JP] Japan .................. 7-191331

[51] Int. Cl.⁶ .................. G05F 1/10; H03K 17/687
[52] U.S. Cl. .................. 327/541; 327/435; 327/109
[58] Field of Search .................. 327/108, 109, 327/111, 427, 430, 431, 434, 435, 530, 538, 540, 541, 543, 560–563, 103

[56] References Cited

U.S. PATENT DOCUMENTS

| | | |
|---|---|---|
| 4,495,471 | 1/1985 | Barrett .................. 330/151 |
| 4,539,491 | 9/1985 | Nishioka et al. .................. 327/103 |
| 5,231,316 | 7/1993 | Thelen, Jr. .................. 327/103 |
| 5,422,593 | 6/1995 | Fujihira .................. 327/563 |
| 5,570,060 | 10/1996 | Edwards .................. 327/538 |
| 5,578,960 | 11/1996 | Matsumura et al. .................. 327/538 |
| 5,625,312 | 4/1997 | Kawakami et al. .................. 327/109 |

OTHER PUBLICATIONS

Jung, *Op–Amp Applications*, p. 170, pub. SAMS, Ed 3.

*Primary Examiner*—Toan Tran
*Attorney, Agent, or Firm*—Young & Thompson

[57] ABSTRACT

To keep a constant gate bias voltage to prevent a saturation output power from being decreased even when a GaAs FET for power amplification is operated near the saturation region, current amplification of an output from an operational amplifier (23) is performed by a transistor (24), and a gate bias voltage (Vg) is supplied to the gate of a GaAs FET (1). The gate bias voltage (Vg) is fed back to one input terminal of the operational amplifier (23), and a voltage obtained through voltage-dividing resistors (21, 22) is supplied to the other input terminal so that the operational amplifier serves as a voltage follower.

2 Claims, 1 Drawing Sheet

BIAS CIRCUIT

BACKGROUND OF THE INVENTION

1. FIELD OF THE INVENTION

The present invention relates to a bias circuit and, more particularly, to a bias circuit which supplies a bias voltage to the gate of a GaAs FET (Field Effect Transistor) for power amplification.

2. DESCRIPTION OF THE PRIOR ART

FIG. 1 is a circuit diagram showing a conventional bias circuit. A source S of a GaAs FET 1 for amplifying a microwave power is grounded. A drain voltage Vd is supplied to a drain D. A gate bias voltage Vg is supplied from a bias circuit 3 to a gate G, thereby amplifying the power of an RF input signal S1 input to the gate G and outputting the RF input signal S1 from the drain D.

The bias circuit 3 divides a bias voltage Vgg through two resistors 31 and 32 to generate the gate bias voltage Vg. In this case, the gate bias voltage Vg is set at a negative potential such that the GaAs FET 1 performs class B or C amplification. In addition, the resistors 31 and 32 of the bias circuit 3 are selected to minimize the influence of the gate current on the gate bias voltage Vg.

As described above, the conventional bias circuit has a simple arrangement using the voltage-dividing resistors. However, as the level of the input signal S1 increases, the gate current also increases to a significant level. Coming close to the saturation region of the input vs. output characteristics, the gate bias voltage varies, so no desired characteristics can be obtained.

More specifically, when the level of the input signal S1 is low, the gate current flows from the source S to the gate G. When the level of the input signal S1 increases, the gate current flows in the reverse direction, i.e., from the gate G to the source S, so that the gate bias voltage is set at a deeper negative potential. For this reason, the output power becomes smaller than the saturation output power obtained when the bias voltage is kept constant.

SUMMARY OF THE INVENTION

It is an object of the present invention to provide a bias circuit which can keep a constant gate bias voltage to prevent the saturation output power from being decreased even when a GaAs FET for power amplification is operated near the saturation region.

According to the present invention, there is provided a bias circuit in which a gate bias voltage is supplied to the gate of a GaAs FET for power amplification through a current amplification element connected to the output terminal of an operational amplifier. The gate bias voltage is fed back to one input terminal of the operational amplifier, and a bias voltage obtained by dividing a constant voltage is supplied to the other input terminal of the operational amplifier, so that the operational amplifier serves as a voltage follower. With this arrangement, the gate bias voltage of the GaAs FET is kept constant with respect to a change in gate current.

DETAILED DESCRIPTION OF THE PREFERRED EMBODIMENT

The present invention will be described below with reference to the accompanying drawing.

Figure 1:
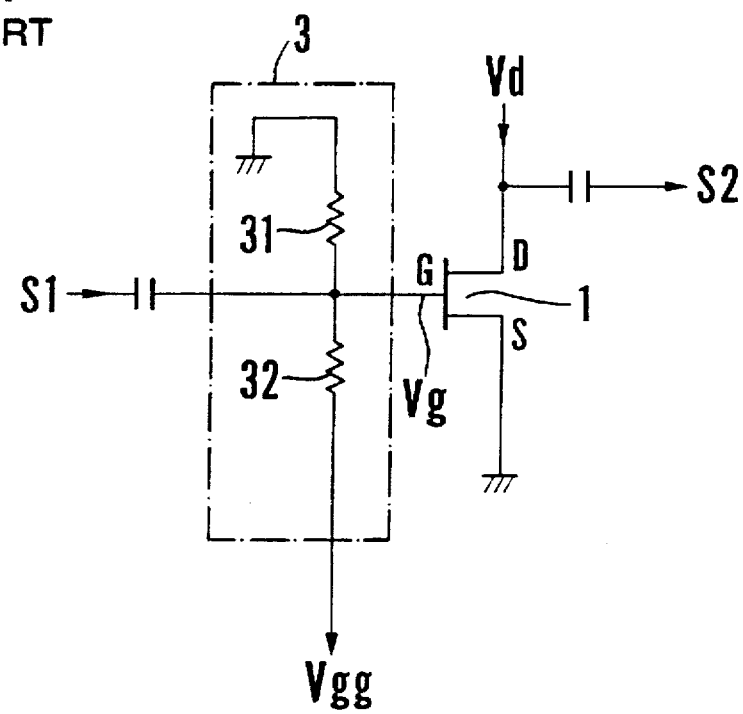
FIG. 1 is a circuit diagram showing a conventional circuit.
Figure 2:
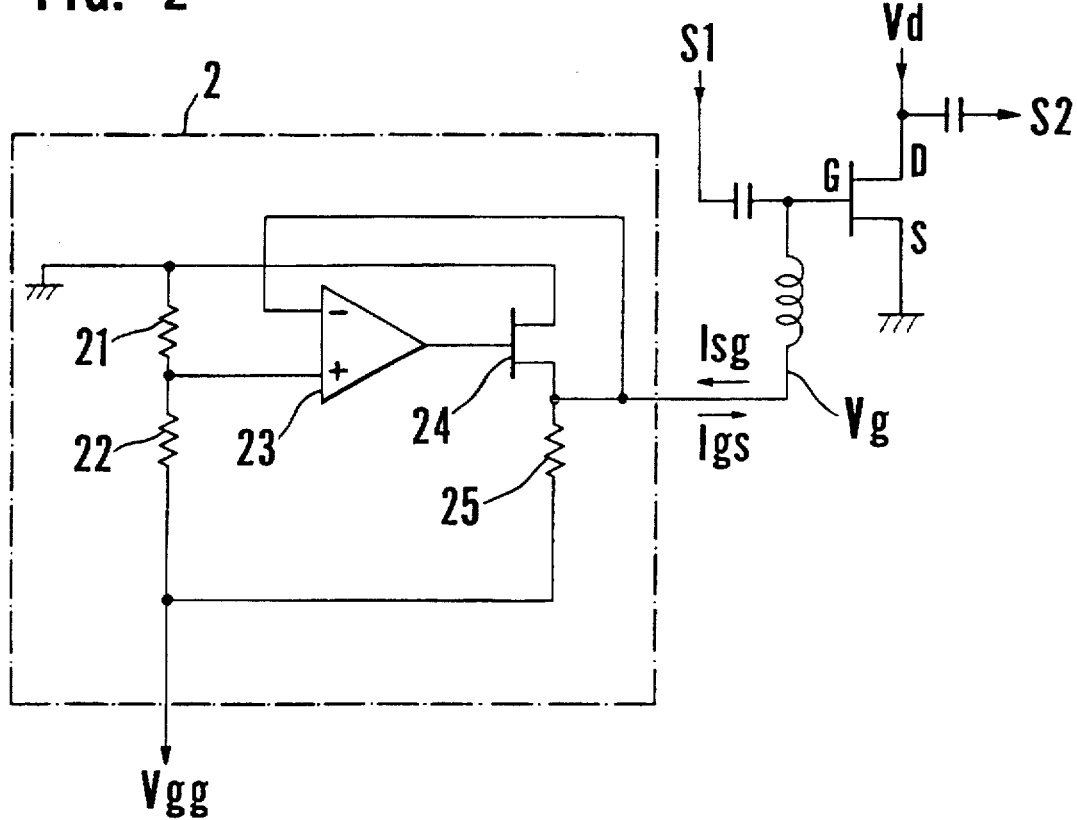
FIG. 2 is a circuit diagram showing an embodiment of the present invention.

FIG. 2 is a circuit diagram showing an embodiment of the present invention. A source S of a GaAs FET 1 is grounded. A drain voltage Vd is supplied to a drain D. A gate bias voltage Vg is supplied from a bias circuit 2 to a gate G, thereby amplifying the power of an RF input signal S1 input to the gate G and outputting the RF input signal S1 as an output signal S2 from the drain D. In this case, the gate bias voltage Vg at a negative potential is supplied to the source such that the GaAs FET 1 performs class B or C amplification.

The bias circuit 2 has voltage-dividing resistors 21 and 22, an operational amplifier 23 serving as a voltage follower, an FET 24 for performing current amplification as a source follower, and a resistor 25 for the source follower. The bias circuit 2 generates the gate bias voltage Vg (negative potential) upon receiving a bias voltage Vgg (negative potential).

The bias voltage Vgg is divided through the resistors 21 and 22 and supplied to the positive input terminal of the operational amplifier 23. The gate bias voltage Vg supplied to the gate of the GaAs FET 1 is fed back to the negative input terminal of the operational amplifier 23. With this arrangement, the operational amplifier 23 functions as a voltage follower and operates such that the gate bias voltage Vg becomes equal to the voltage at the positive input terminal of the operational amplifier 23.

To eliminate the influence on the operational amplifier 23, which is caused when the gate current of the GaAs FET 1 increases in the reverse direction, the FET 24 and the resistor 25 are added as a source follower having a voltage gain of 1.

The operation will now be described.

A gate current from the source S to the gate G of the GaAs FET 1 is defined as Isg, and a gate current from the gate G to the source S is defined as Igs. When the current from the gate G to the source S is positive, a total gate current Ig is represented as follows:

$$Ig = Igs - Isg \tag{1}$$

The gate bias voltage Vg at a negative potential is applied to the gate G of the GaAs FET 1 such that class B or C amplification is performed. For this reason, the current Igs increases as the level of the RF input signal S1 increases. Note that the value of the current Isg is almost constant.

When the level of the RF input signal S1 is low, Igs=0, so that the current Isg from the source S to the gate G flows in the resistor 25. At this time, the current Isg flows in the same direction as that of the drain current of the FET 24, which flows to the resistor 25, and acts to change the gate bias voltage Vg. The drain current of the FET 24 is decreased by the amount of the current Isg so that the gate bias voltage Vg is kept constant.

When the level of the RF input signal S1 increases, the current Igs from the gate G to the source S increases. When Igs=Isg, the gate current Ig=0. When the level of the RF input signal S1 further increases, the current Igs from the gate G to the source S becomes dominant. In this case, the current Igs flows through the resistor 25 in a direction reverse to that of the drain current of the FET 24 and acts to change the gate bias voltage Vg. The drain current of the FET 24 is increased by the amount of the current Igs so that the current flowing through the resistor 25 is kept constant, and the gate bias voltage Vg is also kept constant.

Even when a bipolar transistor connected as an emitter follower is used in place of the FET 24, the same effect as described above can be obtained.

As has been described above, according to the present invention, an output from the operational amplifier is current-amplified and supplied to the GaAs FET as a gate bias voltage. The gate bias voltage is fed back to one input terminal of the operational amplifier, and a voltage obtained through voltage-dividing resistors is supplied to the other input terminal so that the operational amplifier serves as a voltage follower. With this arrangement, the gate bias voltage can be kept constant with respect to a change in gate current of the GaAs FET. Therefore, even when the GaAs FET is operated near the saturation region, the saturation output power can be prevented from being decreased. In an actual circuit, the saturation output power could be increased by 2 to 3 dB as compared to the conventional circuit.

What is claimed is:

1. A bias circuit for supplying a bias voltage to a gate of a GaAs FET for power amplification, comprising:

an operational amplifier having first and second inputs and an output;

a transistor for amplifying current from said output of said operational amplifier, said transistor having a first terminal for outputting said bias voltage to said gate of said GaAs FET, said first terminal being directly connected to said first input of said operational amplifier; and a voltage divider including serially connected first and second resistors, a connection point of said first and second resistors being connected to said second input of said operational amplifier so that said voltage divider supplies an input voltage equal to said bias voltage, to said operational amplifier, said first terminal of said transistor being connected to said first resistor through a third resistor, and a second terminal of said transistor being directly connected to said second resistor.

2. A circuit according to claim 1, wherein said transistor is connected as a source follower or an emitter follower.

* * * * *